United States Patent [19]

Miki et al.

[11] Patent Number: 5,341,037
[45] Date of Patent: Aug. 23, 1994

[54] SAMPLE HOLD CIRCUIT, BUFFER CIRCUIT AND SAMPLE HOLD APPARATUS USING THESE CIRCUITS

[75] Inventors: Takahiro Miki; Toshio Kumamoto, both of Hyogo, Japan

[73] Assignee: Mitsubishi Denki Kabushiki Kaisha, Tokyo, Japan

[21] Appl. No.: 886,904

[22] Filed: May 22, 1992

[30] Foreign Application Priority Data

Aug. 22, 1991 [JP] Japan ................... 3-210908

[51] Int. Cl.⁵ .......................... H03K 5/159
[52] U.S. Cl. ................... 307/352; 307/353; 307/494; 328/151
[58] Field of Search ............... 307/352, 353, 494, 495, 307/499; 328/151

[56] References Cited

U.S. PATENT DOCUMENTS

| | | | |
|---|---|---|---|
| 4,370,572 | 1/1983 | Cosand et al. | 328/151 |
| 4,873,457 | 10/1989 | Sanielevici | 307/353 |
| 5,017,924 | 5/1991 | Guiberteau et al. | 307/352 |

FOREIGN PATENT DOCUMENTS 2069267A 8/1981 United Kingdom .

OTHER PUBLICATIONS

IEEE International Solid–State Circuit Conference Digest of Technical Papers, by Bernard Zojer et al., Feb. 15, 1990, pp. 164–165 and 290.
"Analysis and Design of Analog Integrated Circuit 2nd Edition", John Wiley & Sons, pp. 10–17.

Primary Examiner—Timothy P. Callahan
Assistant Examiner—Tuan Lam
Attorney, Agent, or Firm—Lowe, Price, LeBlanc & Becker

[57] ABSTRACT

Positive and negative output ends of a differential circuit in a sample hold circuit are connected to capacitors through switch circuits. Further, collectors of two input transistors of a buffer circuit connected to the sample hold circuit are driven by a collector driving differential circuit, so as to make the collector-base voltages of two input transistors same to each other. Consequently, a stable sample hold circuit having an arbitrary gain can be provided. In addition, drifts of outputs from two capacitors in the sample hold circuit can be made equal to each other by the buffer circuit.

10 Claims, 10 Drawing Sheets

SAMPLE HOLD CIRCUIT, BUFFER CIRCUIT AND SAMPLE HOLD APPARATUS USING THESE CIRCUITS

BACKGROUND OF THE INVENTION

Field of the Invention

The present invention relates to a differential type sample hold circuit, a buffer circuit having two emitter follower transistors and a sample hold apparatus employing these circuits.

Description of the Background Art

Figure 7:
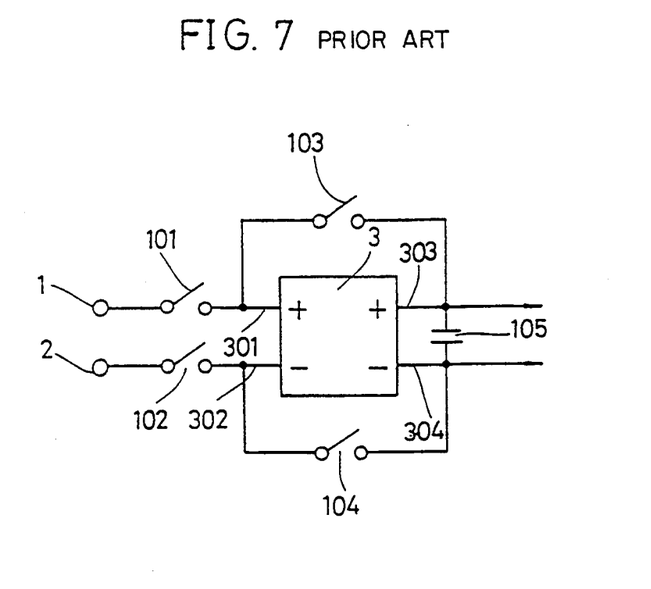
FIG. 7 shows a structure of a conventional sample hold circuit.

FIG. 7 shows a sample hold circuit disclosed in IEEE International Solid-State Circuit Conference Digest of Technical Papers 1990, p.164, for example. The sample hold circuit shown in FIG. 7 is a differential type one which provides an output voltage difference corresponding to an input voltage difference. Referring to the figure, input terminals 1 and 2 are connected to a positive input end 301 and a negative input end 302 of an amplifying circuit 3 through switching circuits 101 and 102, respectively. Positive input end 301 and negative input end 302 are further connected to a positive output end 303 and a negative output end 304 of differential circuit 303 through switching circuits 103 and 104. A capacitor 105 is connected between positive output end 303 and negative output end 304.

Generally, an operation of a sample hold circuit includes a sampling period in which an output thereof follows the input, and a hold period in which the output at the end of the sampling period is maintained. First, general operation of the differential circuit will be described. The differential circuit provides a potential difference corresponding to a potential difference between input terminals as a potential difference between output terminals. Namely, when potentials at positive and negative input ends of the differential circuit are represented by $Vi+$ and $Vi-$ and potentials at positive and negative output ends are represented by $Vo+$ and $Vo-$, respectively, the operation of the differential circuit is represented by the following equations (1) and (2).

$$Vo+ = Voc + (A/2)(Vi+ - Vi-) \quad (1)$$

$$Vo- = Voc - (A/2)(Vi+ - Vi-) \quad (2)$$

When $Vi+ = Vi-$, voltages at positive and negative output ends are both at Voc (hereinafter, the voltage Voc will be referred to as the same phase output voltage). In the above equations (1) and (2), the reference character A denotes a gain of the output potential difference with respect to the input potential difference, that is, the differential gain.

The operation of the conventional sample hold circuit shown in FIG. 7 will be described in the following. It is assumed that the differential gain A of the differential circuit is set at approximately 1.

In the sample period, switch circuits 101 and 102 are set to the ON state (conductive state) and switch circuits 103 and 104 are set to OFF state (cut-off state). Therefore, the output potential difference between the positive output end 303 and the negative output end 304 in the sampling period follows the input voltage difference applied between the input terminals 1 and 2 so as to be the same as the input voltage difference.

In the hold period, switch circuits 101 and 102 are turned OFF and switch circuits 103 and 104 are turned ON. The output potential difference of the differential circuit 3 at the moment of switching of the switch circuits 101 to 104 is maintained by capacitor 105. Thereafter, the output potential difference between the positive output end 303 and the negative output end 304 in the hold period is maintained constant unless the input potential difference of the differential circuit 3 changes. In the hold period, the positive output end 303 and positive input end 301 are connected by switch circuits 103 and 104, and negative output end 304 and negative input end 302 are connected, and therefore an output of the differential circuit 3 is positively feedback to the input side thereof. Therefore, if the differential gain A of differential circuit 3 is exactly 1, the input potential difference of differential circuit 3 is not changed, and therefore the output potential difference can be maintained.

Figure 8:
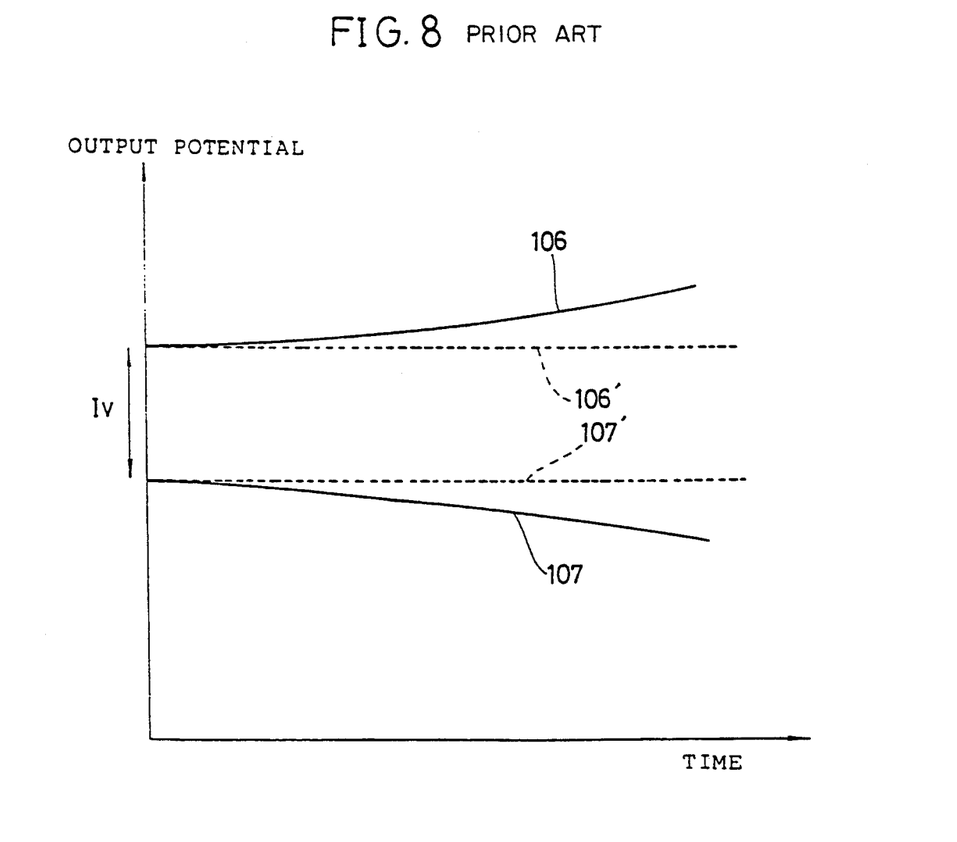
FIG. 8 shows an operation of the conventional sample hold circuit.

The following problem occurs in the sampling period in the conventional sample hold circuit when differential gain of differential circuit 3 is not exactly 1. For example, let us assume that output difference potential of differential circuit 3 at the moment of switching of switch circuits 101 to 104 is 1V and differential gain is 1.01. Differential circuit 3 is assumed to transmit a change in input potential differential to the output end by 5 nano seconds, and it is assumed that there is no delay in switch circuits 101 to 104 and in other portions. The output potential difference of differential circuit 3 at the moment of change from the sampling period to the hold period 1V. This output potential difference is transmitted to the input end of differential circuit 3 and amplified by the differential gain of 1.01, so that the potential difference at the output end of differential circuit 3 after the lapse of 5 nano seconds becomes 1.01V. This output potential difference of 1.01V is again returned to the input end of differential circuit 3 as the input potential difference. Therefore, after the lapse of further 5 nano seconds, the potential difference at the output end attains 1.0201V. In this manner, the potential difference held in capacitor 105 increases as time passes, as shown in FIG. 8. Referring to FIG. 8, doted lines 106' and 107' show potential changes in the ideal case where A=1, and solid lines 106 and 107 show potential changes when A>1. The doted line 106' and the solid line 106 show potentials at the positive output end 303, and the doted line 107' and the solid line 107 show potential at the negative output end 304.

As described above, there is a positive feedback to differential circuit 3 during the hold period in the conventional sample hold circuit shown in FIG. 7, so that it is impossible to intentionally set the gain of the sample hold circuit other than 1, and even if the gain is slightly offset from 1 undesirably because of variations during manufacture, the output becomes unstable.

A conventional buffer circuit using an emitter follower will be described with reference to FIG. 9 and 10. An emitter follower circuit has a high input impedance and low output impedance and is widely used as means for improving capability of driving input signals. The buffer output circuit shown in FIGS. 9 and 10 includes two sets of emitter follower circuits. One emitter follower circuit includes an NPN bipolar transistor 203 and a constant current circuit 205. The other emitter follower circuit includes an NPN bipolar transistor 204 and a constant current circuit 206. Collectors of transistors 203 and 204 are connected to the same power supply (supply voltage Vcc). The emitter of transistor 203 is connected to constant current circuit 205, and the emitter of transistor 204 is connected to the constant current circuit 206. Constant current circuit 205 and 206 have the same current values. The base of transistor 203 is connected to an input terminal 201, and base of transistor 204 is connected to the input terminal 202.

Figure 9:
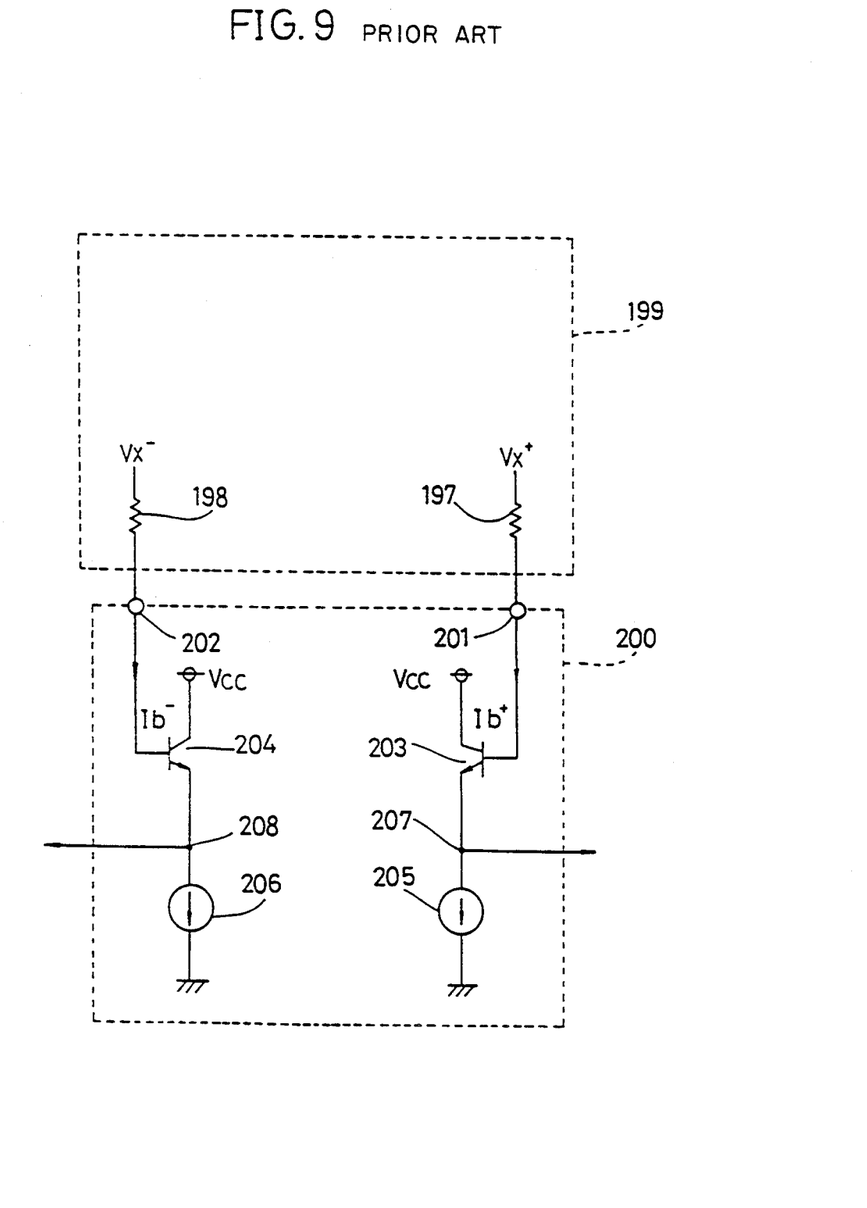
FIG. 9 shows a structure of a conventional buffer circuit.

Referring to FIG. 9, input terminals 201 and 202 of buffer circuit 200 are connected to a voltage generating circuit 199 having high output impedance. Voltage generating circuit 199 includes output impedances 197 and 198 which are identical and having relatively high resistance value. Referring to FIG. 10, input terminals 201 and 202 are connected to a voltage generating circuit 180 employing capacitors. Voltage generating circuit 180 includes capacitors C1 and C2 having the same capacitance value. One electrode of capacitor C1 is connected to input terminal 201, and one electrode of capacitor C2 is connected to input terminal 202. The other electrode of each of the capacitors C1 and C2 is connected to a reference potential source, for example, the ground. Capacitors C1 and C2 are charged by an external charging current. After the completion of charging of capacitors C1 and C2, voltages maintained in capacitors C1 and C2 are applied to the bases of transistors 203 and 204, respectively.

The operation of the buffer circuit 200 shown in FIGS. 9 and 10 will be described.

Since transistors 203 and 204 have the same emitter current, the base-emitter voltage of transistor 203 and base-emitter voltage of transistor 204 have the same and constant value. Therefore, potential difference between input terminals 201 and 202 of buffer circuit 200 appears directly as the potential difference between output nodes 207 and 208. The influence of a base current $I_b+$ flowing through transistor 203 and base current $I_b-$ flowing through transistor 204 will be discussed.

Referring to FIG. 9, the output potential of voltage generating circuit 199, that is, potentials at input terminals 201 and 202 of buffer circuit 200 are represented as $V_x+$ and $V_x-$, respectively, when base currents of transistors 203 and 204 are 0. Referring to FIG. 9, base currents $I_b+$ and $I_b-$ flow through output impedances 197 and 198 of voltage generating circuit 199, causing voltage drops $I_b+ \cdot r$ and $I_b- \cdot r$. When base currents of transistors 203 and 204 are the same, the voltage drops are the same. Therefore, the two output values themselves of voltage generating circuit 199 drop because of the influence of base currents of transistors 203 and 204. However, the potential difference is not influenced and is maintained at $(V_x+ - V_x-)$.

Figure 10:
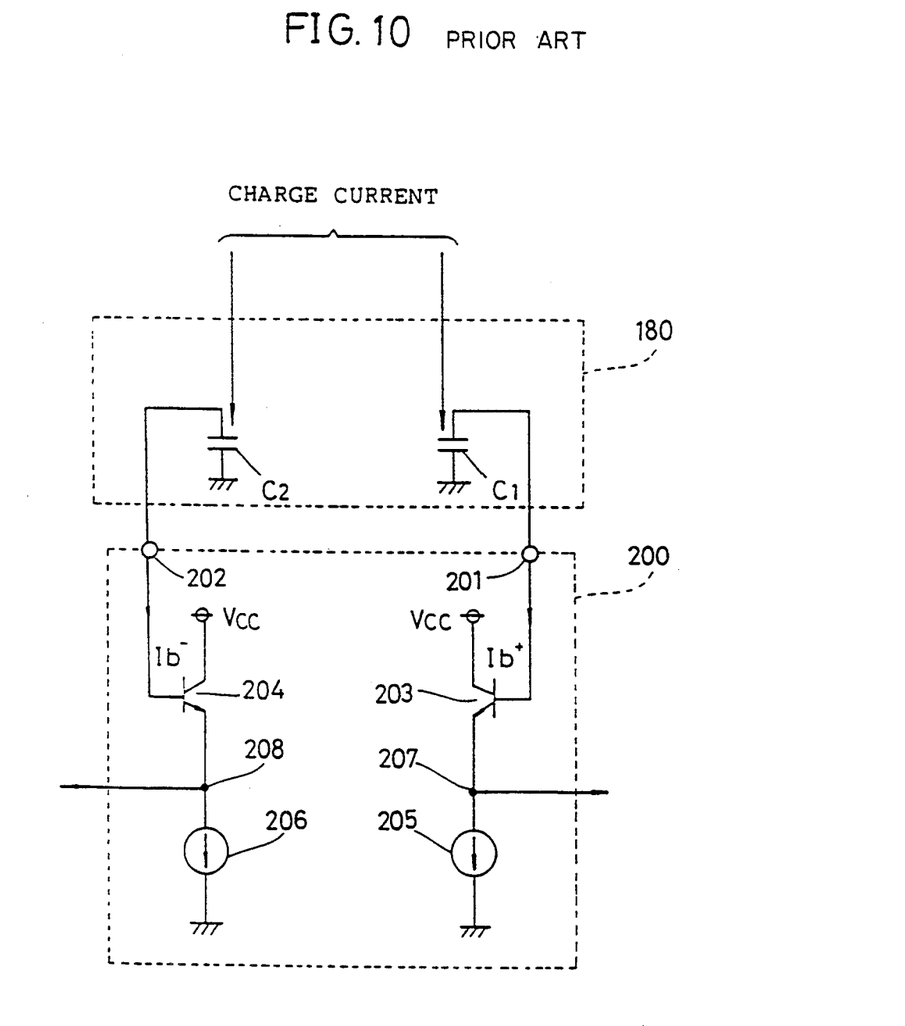
FIG. 10 shows a structure of a conventional buffer circuit.

Referring to FIG. 10, during discharging period of capacitors C1 and C2, when base currents $I_b+$ and $I_b-$ flow from capacitors C1 and C2, capacitors C1 and C2 lose there currents, and voltage drifts $(I_b+ \cdot t/C)$ and $(I_b- \cdot t/C)$ are generated. The reference character t represents the time lapse from the start of discharging period of the capacitors C1 and C2. When base currents $I_b+$ and $I_b-$ of transistors 203 and 204 are the same, the output voltage drifts are the same at an arbitrary time. Therefore, although the two output values of voltage generating circuit 180 lower as time passes because of the influence of base currents of transistors 203 and 204, the difference is always $(V_x+ - V_x-)$, not influenced by the currents. The time change of the two output voltages from voltage generating circuit 180 in this ideal case are shown by dotted lines 181' and 182' in FIG. 11.

As described above, if base currents of two transistors 203 and 204 in buffer circuit 200 are the same, the output potential difference of voltage generating circuit 199 or 180 connected to buffer circuit 200 is not influenced. However, if the emitter current is constant in bipolar transistors, base currents differ slightly due to a so called early effect, when the collector-base voltages are different. In the conventional buffer circuit 200 shown in FIGS. 9 and 10, collectors of transistors 203 and 204 are commonly connected to a power supply having the constant potential of Vcc. However, since the base voltages are different from each other, the collector-base voltage of transistor 203 is different from that of transistor 204. More specifically, when base potentials of transistors 203 and 204 are represented by $V_b+$ and $V_b-$ and collector-base voltages of transistors 203 and 204 are represented by $V_{cb}+$ and $V_{cb}-$, then there is the following relation:

$$V_{cb}+ = V_{cc} - V_b+ \tag{3}$$

$$V_{cb}- = V_{cc} - V_b- \tag{4}$$

Accordingly, the difference between the collector-base voltages $V_{cb}+$ and $V_{cb}-$ of these transistors is represented as $$V_{cb}+ - V_{cb}- = V_b+ - V_b- \tag{5}$$

Figure 12:
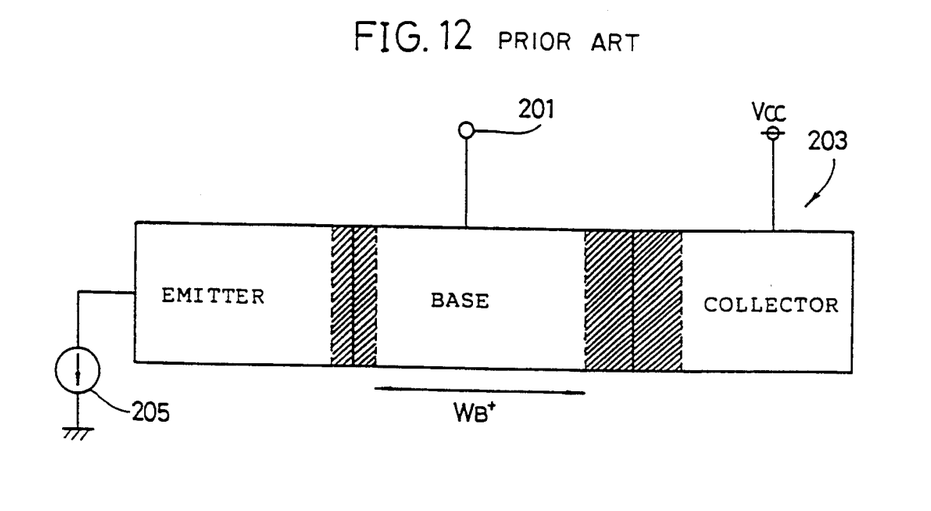
FIG. 12 schematically shows states of operation of transistor 203 of FIGS. 9 and 10.
Figure 13:
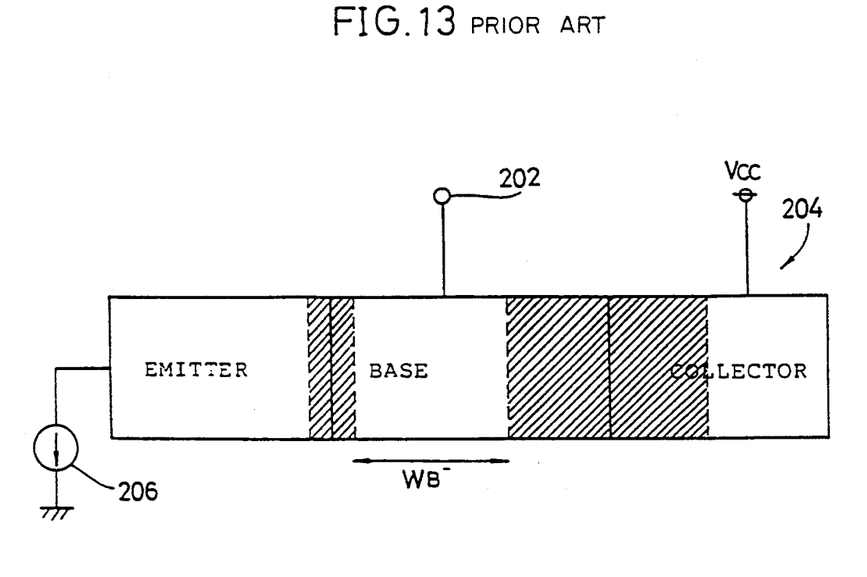
FIG. 13 schematically shows an operation of transistor 204 of FIG. 9 and 10.

Generally, when different voltages are applied to a PN junction surface of a bipolar transistor, as represented by the above equation, the width of depletion layer generated at that portion differs, as is well known (when reverse bias voltage is large, the depletion layer becomes thick, and if the voltage is small, the depletion layer becomes thinner). Because of this influence, substantial base width differs. FIGS. 12 and 13 schematically show the manner thereof. When the base potential of bipolar transistor 203 shown in FIG. 12 is higher than the base potential of bipolar transistor 204 shown in FIG. 13, potential difference between the collector and the base in transistor 203 is smaller than the potential difference in transistor 204. Therefore, a depletion layer (hatched portion in the figure) thinner than that of transistor 204 is generated between the collector and the base of transistor 203, and accordingly, the base width $W_B+$ of transistor 203 becomes larger than the base width $W_B-$ of transistor 204.

If current distribution ratio of the emitter current to the base and the collector is $1:\beta_F$, the value $\beta_F$ is provided in accordance with the following equation (6) (see an equation (1.48) disclosed in "Analysis and Design of Analog Integrated Circuits 2nd Edition" published by John Wiley & Sons).

$$\beta_F = 1/[\{W_B^2/(2\tau_b D_n)\} + (D_P/D_n)(W_B/L_P)(N_A/N_D)] \tag{6}$$

In the equation (6), reference characters $T_p$, $D_n$ and $N_A$ represent life of minority carriers, diffusion coefficient of minority carriers and impurity concentration at the base, respectively. The reference characters $L_P$, $D_P$ and $N_D$ represent diffusion length of minority carriers, coefficient of diffusion and impurity concentration at the emitter, respectively. As is apparent from the equation (6), $\beta_F$ becomes smaller as the base width $W_B$ becomes larger, and more current is distributed to the base. The base current differs when the collector-base voltages are different, even if the emitter currents of bipolar transistors 203 and 204 are the same.

Figure 11:
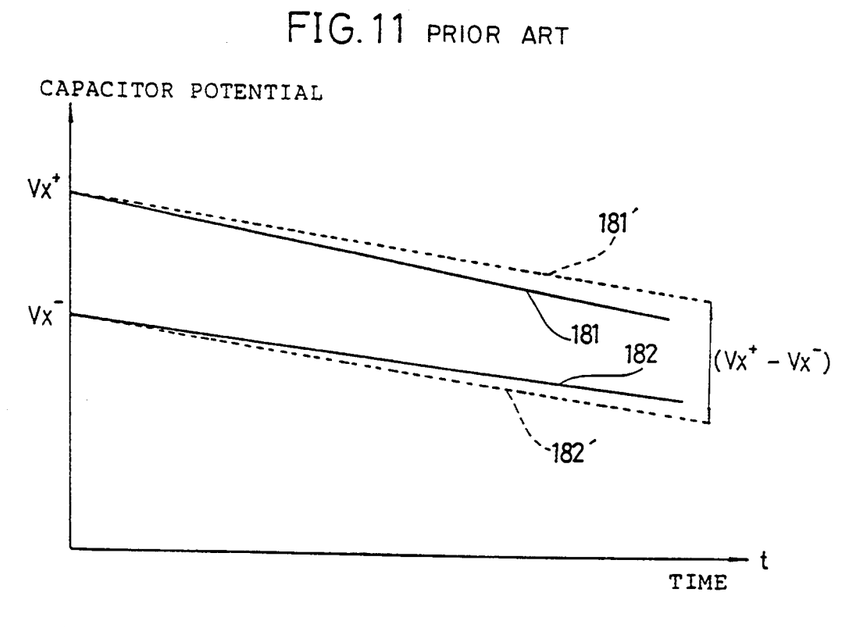
FIG. 11 shows an operation of voltage generating circuit 180 of FIG. 10.

In the conventional example shown in FIG. 9 in which voltage generating circuit 199 having relatively high output impedance is connected to buffer circuit 200 in which different base currents flow through two emitter follower transistors 203 and 204, different voltage drops occur at output impedances 197 and 198, and hence the potential difference appearing at input ends 201 and 202 differs from the desired value (Vx+ −Vx−). In the conventional example of FIG. 10 in which voltage generating circuit 180 providing an output voltage by the voltages held in capacitors C1 and C2 is connected to buffer circuit 200, voltage drifts of capacitors C1 and C2 are different from each other, the potential difference appearing at input terminals 201 and 202 is different rom the desired value (Vx+ −Vx−), and further it changes as time passes. The solid lines 181 and 182 of FIG. 11 schematically shows the manner thereof.

As described above, in the conventional sample hold circuit shown in FIG. 7, there is a positive feedback to differential circuit 3 in the hold period, so that it is impossible to intentionally set the gain of the sample hold circuit other than 1, and when the gain slightly differs from 1 due to varieties on manufacture, the output becomes unstable.

In the conventional buffer circuit 200 shown in FIGS. 9 and 10, different base currents of transistors 203 and 204 affects the output voltage difference of the voltage generating circuit, when the voltage generating circuit connected to the buffer circuit has relatively high output impedance or when the output voltage is provided by the voltages held in capacitors.

SUMMARY OF THE INVENTION

An object of the present invention is to provide a sample hold circuit in which the gain can be arbitrarily set and which provides stable output.

Another object of the present invention is to provide, even when a voltage generating circuit having a large output impedance is connected or the voltage generating circuit provides an output voltage by voltages held in capacitors is connected, a buffer circuit which does not affect the output voltage difference from such output generating circuits.

A further object of the present invention is to provide an emitter follower apparatus which can operate stably, having a differential sample hold circuit and a buffer circuit.

The sample hold circuit in accordance with the present invention includes a differential circuit, first and second switching means and first and second capacitors. The differential circuit includes first and second input terminals, and first and second output terminals in which output voltage difference between the first and second output terminals change corresponding to an input voltage difference between the first and second input terminals. The first and second switching means are kept ON during a sampling period, and they are kept OFF during a hold period. The first capacitor has one electrode connected to the first output terminal of the differential circuit through the first switching means, and the other electrode connected to a reference potential source. The second capacitor has one electrode connected to the second output terminal of the differential circuit through the second switching means, and the other electrode connected to the reference potential source.

The buffer circuit in accordance with the present invention includes first and second bipolar transistors, first and second constant current sources and collector voltage controlling means. The first bipolar transistor receives a first analog signal at its base. The second bipolar transistors receives a second analog signal at its base. The first constant current source is connected to the emitter of the first bipolar transistor. The second constant current source is connected to the emitter of the second bipolar transistor, and it has approximately the same current value as the first constant current source. The collector voltage controlling means controls collector voltages of the first and second bipolar transistors such that the collector·base voltage of the first bipolar transistor is always the same as the collector·base voltage of the second bipolar transistor.

The sample hold apparatus of the present invention includes a differential type sample hold circuit for sampling and holding voltage difference between two analog signals input thereto, and a buffer circuit including two sets of emitter follower circuits, receiving two analog signals which have been sampled and held by the sample hold circuit for outputting two analog signals having a voltage difference corresponding to the voltage difference between these two analog signals. The sample hold circuit includes a differential circuit, first and second switches and first and second capacitors. The differential circuit includes first and second input terminals and first and second output terminals, and output voltage difference between the first and second output terminals change dependent on the input voltage difference between the first and second input terminals. The first and second switching means are kept ON in the sampling period, and kept OFF in the holding period. The first capacitor has one electrode connected to the first output terminal of the differential circuit through the first switching means, and the other electrode connected to a reference potential source. The second capacitor has one electrode connected to the second output terminal of the differential circuit through the second switching means, and the other electrode connected to the reference potential source. The buffer circuit includes first and second bipolar transistors, first and second constant current sources and a collector current control means. The first bipolar transistor has its base connected to one electrode of the first capacitor. The second bipolar transistor has its base connected to one electrode of the second capacitor. The first constant current source is connected to the emitter of the first bipolar transistor. The second constant current source is connected to the emitter of the second bipolar transistor, and has approximately the same current values as the first constant current source. The collector current control means controls collector voltages of the first and second bipolar transistors such that the collector·base voltage of the first bipolar transistor is always the same as the collector·base voltage of the second bipolar transistor.

In the sample hold circuit of the present invention, the first and second switching means are turned OFF at the change from the sampling period to the holding period, so that the first and second capacitors hold the output voltage of the differential circuit. Consequently, during the holding period, the first and second capacitors are separated from the differential circuit, and thus the output voltage becomes stable.

In the buffer circuit of the present invention, even if the base potentials of the first and second bipolar transistors are not the same, the collector voltages of the first and second bipolar transistors are controlled by the collector voltage controlling means, and therefore the collector-base voltages of the first and second bipolar transistors are always the same. Therefore, the base currents of the first and second bipolar transistors are the same, and therefore the output voltage difference of the voltage generating circuit connected to the buffer circuit is not affected. The sample hold apparatus of the present invention includes the sample hold circuit and the buffer circuit function as described above. Therefore, stable operation is realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
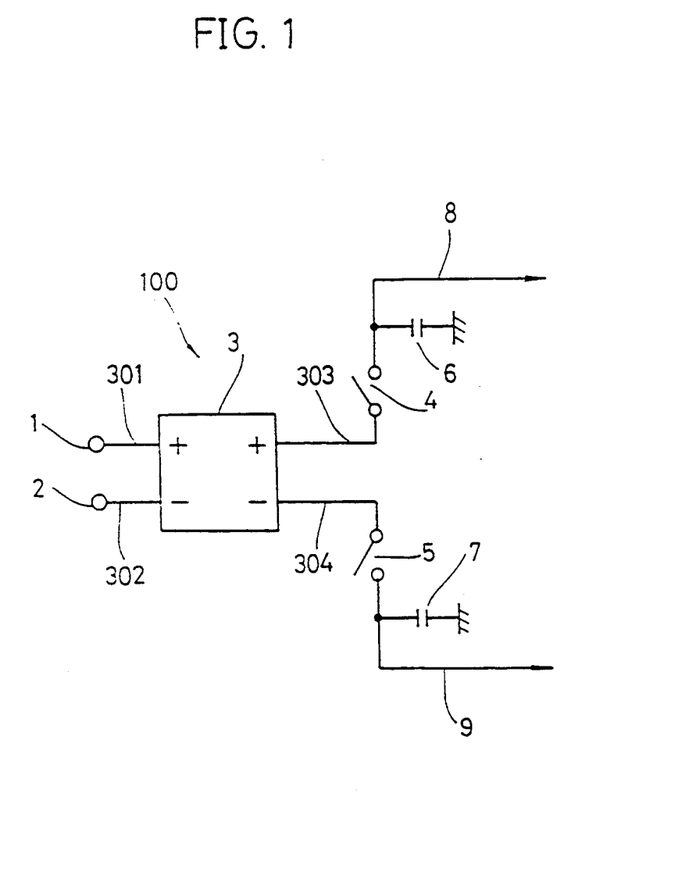
FIG. 1 shows a structure of a sample hold circuit in accordance with one embodiment of the present invention.

FIG. 1 shows a structure of a sample hold circuit in accordance with one embodiment of the present invention. Referring to the figure, input terminals 1 and 2 are directly connected to a positive input end 301 and a negative input end 302 of a differential circuit 3, respectively. A positive output end 303 and a negative output end 304 of differential circuit 3 are connected to one electrode of capacitor 6 and one electrode of capacitor 7 through switch circuits 4 and 5, respectively. The other electrode of capacitor 6 and that of capacitor 7 are connected to a reference potential source (for example, ground). An output from sample hold circuit 100 is provided from output nodes 8 and 9 which are connected to one electrode of capacitor 6 and one electrode of capacitor 7, respectively.

The operation of sample hold circuit 100 shown in FIG. 1 will be described. In the sampling period, switching circuits 4 and 5 are turned ON. Therefore, potential difference at output node 8 and 9 in the sampling period becomes the same as the output potential difference of differential circuit 31, and it follows the difference between input voltages applied to input terminals 1 and 2. When the holding, period starts, the switching circuits 4 and 5 are turned OFF. Consequently, the output potential difference at the moment of switching of the switching circuits 4 and 5 is held by the capacitors 6 and 7. Since the capacitors 6 and 7 are separated from differential circuit 3 by switching circuits 4 and 5 from this time on, the potential difference at output nodes 8 and 9 is not affected even if the input potential difference of differential circuit 3 changes and correspondingly the output potential difference changes.

The above described operation realized regardless of the differential gain of differential circuit 3. Therefore, when the differential gain of the sample hold circuit as a whole is to be increased, what is necessary is only to increase the gain of differential circuit 3. In comparison, in the conventional ample hold circuit shown in FIG. 7, the differential gin of the differential circuit 3 must be fixed exactly at 1. Therefore, when the differential gain of the sample hold circuit as a whole is to be increased, differential amplifiers should be cascade connected newly to the output side of the differential circuit 3. When a buffer circuit in accordance with the present invention which will be described in the following is connected to output nodes 8 and 9 of the sample hold circuit shown in FIG. 1, especially stable outputs can be provided.

Figure 2:
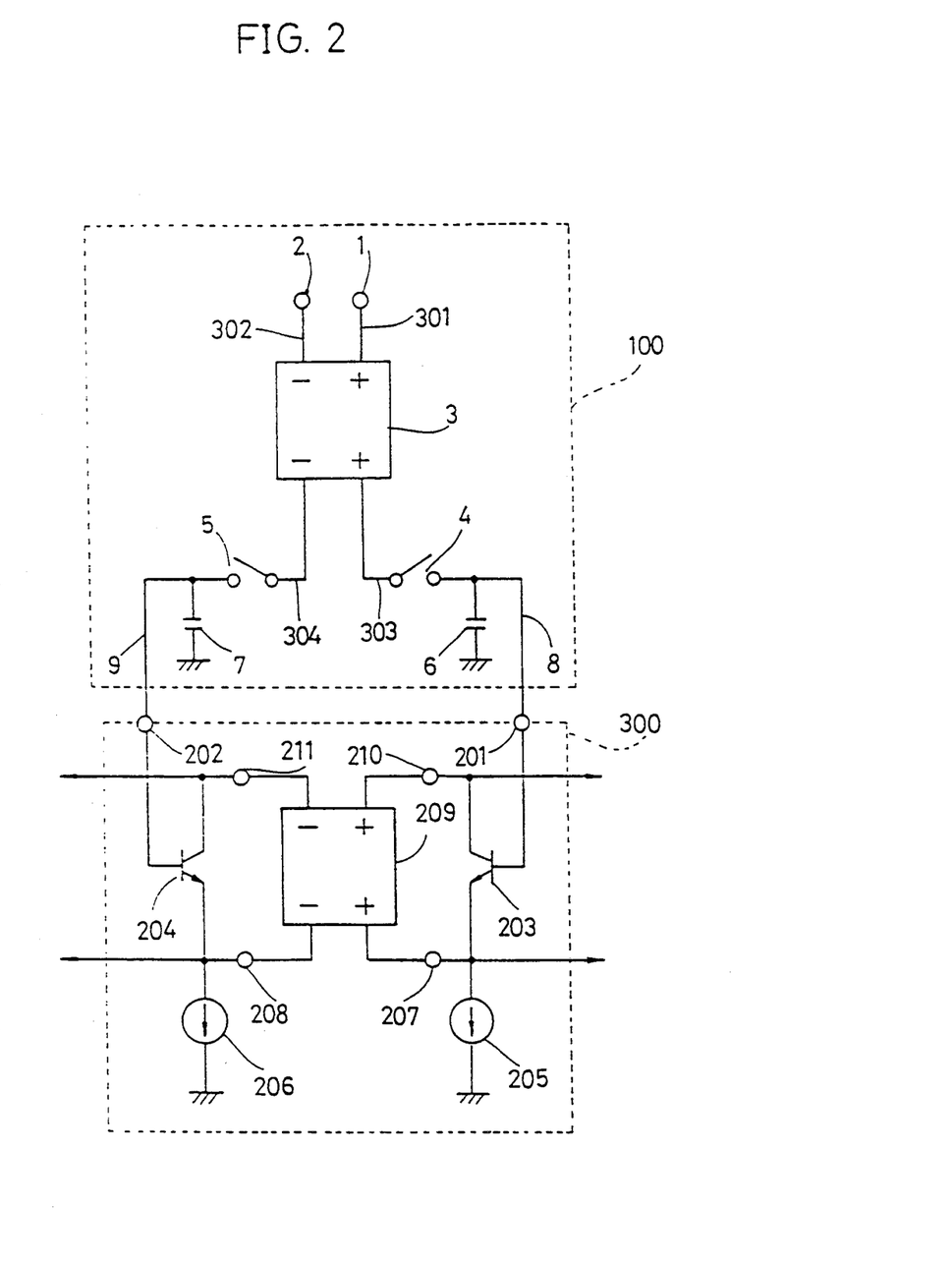
FIG. 2 shows a structure of a sample hold apparatus in accordance with one embodiment of the present invention.

FIG. 2 shows a structure of a sample hold apparatus in accordance with one embodiment of the present invention. The sample hold apparatus shown in FIG. 2 includes sample hold circuit 100 shown in FIG. 1 connected to a buffer circuit 300. The structure of sample hold circuit 100 is completely the same as that of sample hold circuit 100 shown in FIG. 1, and therefore description thereof is not repeated. The structure of buffer circuit 300 will be described.

Buffer circuit 300 includes, as does the conventional buffer circuit 200 shown in FIGS. 9 and 10, NPN bipolar transistors 203 and 204, and constant current circuits 205 and 206 having the same current value. Buffer circuit 300 further includes a differential circuit 209. Collectors of transistors 203 and 204 are connected to positive output terminal 210 and negative output terminal 211 of differential circuit 209, respectively. Bases of transistors 203 and 204 are connected to input terminals 201 and 202, respectively. The emitter of transistor 203 is connected to constant current circuit 205 and to a positive input terminal 207 of differential circuit 209. The emitter of transistor 204 is connected to constant current circuit 206 and to a negative input terminal 208 of differential circuit 209. Input terminals 201 and 202 of buffer circuit 300 are connected to output nodes 8 and 9 of sample hold circuit 100, respectively.

Figure 3:
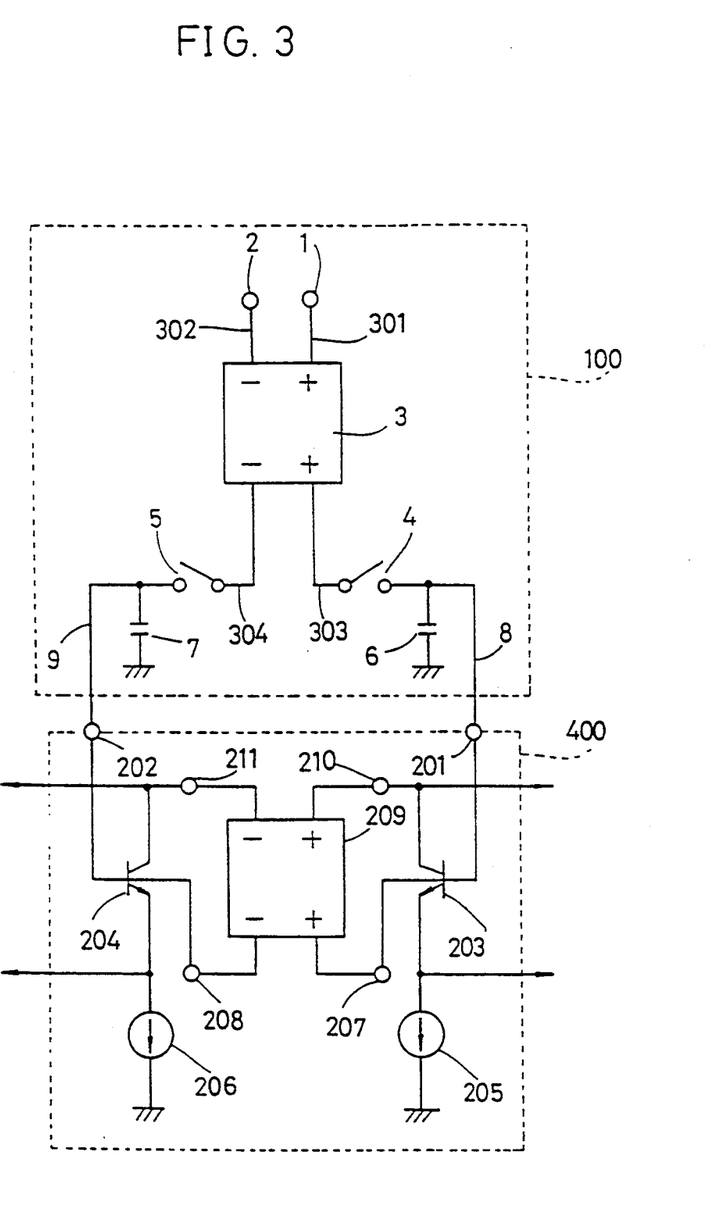
FIG. 3 shows a structure of a sample hold apparatus in accordance with another embodiment of the present invention.

FIG. 3 shows a structure of a sample hold apparatus of another embodiment of the present invention. In the sample hold apparatus shown in FIG. 3, a buffer circuit 400 is connected to sample hold circuit 100. Positive input terminal 207 of differential circuit 209 in buffer circuit 400 is connected to the base of transistor 203 and to input terminal 201. A negative input terminal 208 of differential circuit 209 is connected to the base of transistor 204 and to an input terminal 202. Other structures of the sample hold apparatus shown in FIG. 3 are the same as those of the sample old apparatus shown in FIG. 2, and the corresponding portions are denoted by the same reference numerals. Therefore, the description thereof is not repeated.

The operation of the sample hod circuit shown in FIGS. 2 and 3 is completely the same as the sample hold circuit 100 shown in FIG. 1. Therefore, the operation of buffer circuit 300 shown in FIG. 2 and of buffer circuit 400 shown in FIG. 3 will be described.

Referring to FIGS. 2 and 3, since the emitter currents of the transistors 203 and 204 are the same, the base-emitter voltages of the transistors 203 and 204 have the same and constant value. Therefore, potential difference between input terminals 201 and 202 directly appears as the potential difference between the positive input terminal 207 and the negative input terminal 208 of the differential circuit 209. The positive and negative inputs of differential circuit 209 are connected to emitters of transistors 203 and 204 in FIG. 2, and directly to input terminals 201 and 202 in FIG. 3. Therefore, in either the buffer circuit 300 shown in FIG. 2 or buffer circuit 400 shown in FIG. 3, input potential difference of differential circuit 209 is equal to the potential difference between input rminals 201 and 202. At this time, positive and negative outputs from differential circuit 209 are applied in accordance with the above equations (1) and (2).

More specifically, by representing base potentials of transistors 203 and 204 by Vb+ and Vb− and collector-base voltages of transistors 203 and 204 by Vcb+ and Vcb−, respectively, the following equations are applied.

$$Vcb^+ = Voc + (A/2)(Vb^+ - Vb^-) - Vb^+ \quad (7)$$

$$Vcb^- = Voc + (A/2)(Vb^+ - Vb^-) - Vb^- \quad (8)$$

Therefore, the difference between collector-base voltages Vcb+ and Vcb− of transistors 203 and 204 is represented by $$Vcb^+ - Vcb^- = (A-1)(Vb^+ - Vb^-) \quad (9)$$

in the above equations (7) to (9), the reference character Voc represents the same phase output voltage of differential circuit 209, and A represents differential gain of differential circuit 209. Compared with the above equation (5), when differential gain of differential circuit 209 is larger than 0 and smaller than 2, the difference between collector-base voltage of transistor 203 and collector-base voltage of the transistor 204 is smaller in buffer circuit 300 or 400 of the present invention than the conventional buffer circuit 200. Consequently, in buffer circuits 300 and 400, the difference between the base current of transistor 203 and the base current of transistor 204 s also made smaller. Therefore, in the hold period, the drift of the output voltages of capacitors 6 and 7 in sample hold circuit 100 are approximately the same. Consequently, buffer circuits 300 and 400 do not affect the output potential difference of sample hold circuit 100, enabling stable output from sample hold circuit 100. Especially when the differential gain A of differential circuit 209 near 1, the difference between collector-base voltage of transistor 203 and collector-base voltage of transistor 204 becomes approximately 0, providing remarkable effect. Outputs from buffer circuits 300 and 400 are taken from the emitter or the collector of the transistor 203 and the emitter or the collector of the transistor 204, respectively.

Various differential circuits 209 having the function represented by the above equations (1) and (2) have been known and disclosed in various textbooks, data books and articles for institutes of the art. The above mentioned "Analysis and Design of Analog Integrated circuits 2nd Edition" is included in these known prior art.

Figure 4:
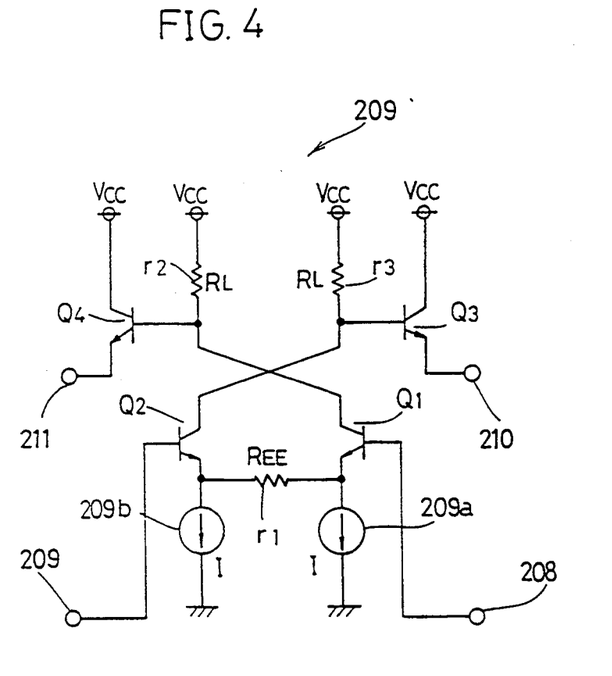
FIG. 4 is a circuit diagram showing an example of the structure of differential circuit 209 shown in FIGS. 2 and 3.

FIG. 4 is a circuit diagram showing an example of the structure of the differential circuit 209 shown in FIGS. 2 and 3. Since such a differential circuit 9 has been known, only the operation thereof is briefly described. When potentials at positive input terminal 209 and negative input terminal 208 of differential circuit 209 are represented by Vi+ and Vi−, the potential difference at both ends of a resistance r1 (having the resistance value of $R_{EE}$) is approximately the same as (Vi+ − Vi−), and a current (Vi+ − Vi−)/$R_{EE}$ flows through resistance r1. Therefore, the current which flows ti load resistance r2 (having the resistance value of $R_L$) connected to the collector of a transistor Q1 is the output current I of the constant current circuit 209a connected to the emitter of transistor Q1 plus the current (Vi+ − Vi−)/$R_{EE}$. The current flowing to a load resistance R3 (having the resistance value of $R_L$) connected to the collector of transistor Q2 is the output current I of constant current circuit 209b connected to the emitter of transistor Q2 minus the current (Vi+ − Vi−)/$R_{EE}$. Therefore, the base voltage Vb3 of transistor Q3 and the base voltage Vb4 of transistor Q4 are represented by $$Vb3 = Vcc - I \cdot R_L + (R_L/R_{EE})(Vi^+ - Vi^-) \quad (10)$$

$$Vb4 = Vcc - I \cdot R_L - (R_L/R_{EE})(Vi^+ - Vi^-) \quad (11)$$

where potential on the power supply side of load resistances r2 and r3 is Vcc.

Further, since approximately the same emitter current flows through transistors Q3 and Q4 because of constant current circuits 205 and 206 (see FIGS. 2 and 3), the amount of voltage shift along the base-emitter of the transistors Q3 and Q4 are equal to each other. This amount of shift is represented by $V_{BE}$. The potential Vo+ at the positive output end 210 and the potential Vo− of the negative output terminal 211 of differential circuit 209 are respectively represented as $$Vo^+ = Vcc - I \cdot R_L - V_{BE} + (R_L/R_{EE})(Vi^+ - Vi^-) \quad (12)$$

$$Vo^- = Vcc - I \cdot R_L - V_{BE} - (R_L/R_{EE})(Vi^+ - Vi^-) \quad (13)$$

The above equations (12) and (13) are the same as the equations (1) and (2) when Voc=Vcc−I·$R_L$−$V_{BE}$, A=2$r_L$/$R_{EE}$. If the value $R_{EE}$ is set to b $R_{EE}$=2$R_L$, the differential gain A will be 1.

In the embodiment shown in FIG. 3, since input terminals 207 and 208 of differential circuit 209 are directly connected to input terminals 201 and 202 of the buffer circuit 400, input currents o differential circuit 209 must be equal to each other.

Figure 5:
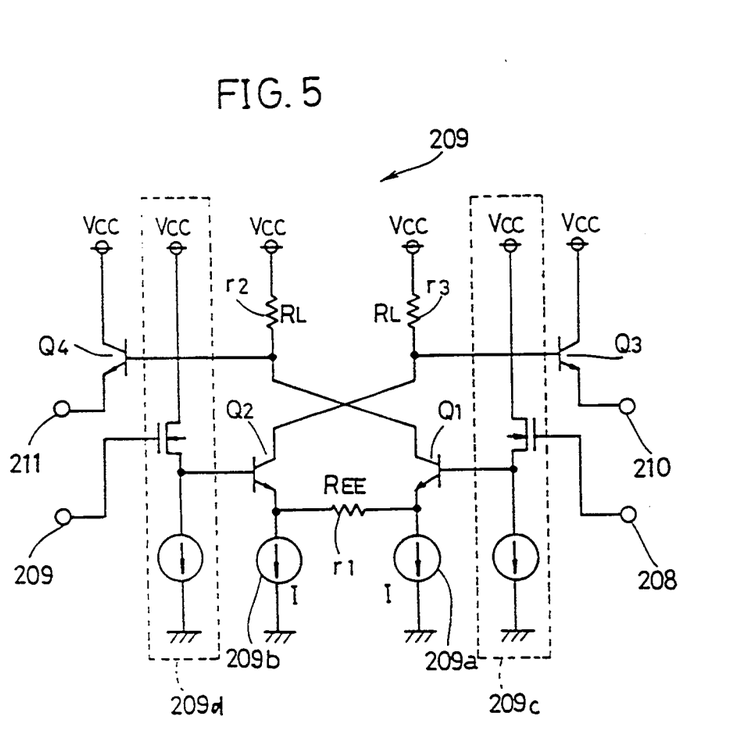
FIG. 5 is a circuit diagram showing another example of the structure of differential circuit 209 shown in FIGS. 2 and 3.

FIG. 5 shows a structure in which source follower circuits 209c and 209d employing MO transistors are added to the input portion of the circuit shown in FIG. 4. In the differential circuit shown in FIG. 5, input currents of input terminals 208 and 209 are both 0, and therefore it is suitable for such an embodiment as shown in FIG. 3.

Figure 6:
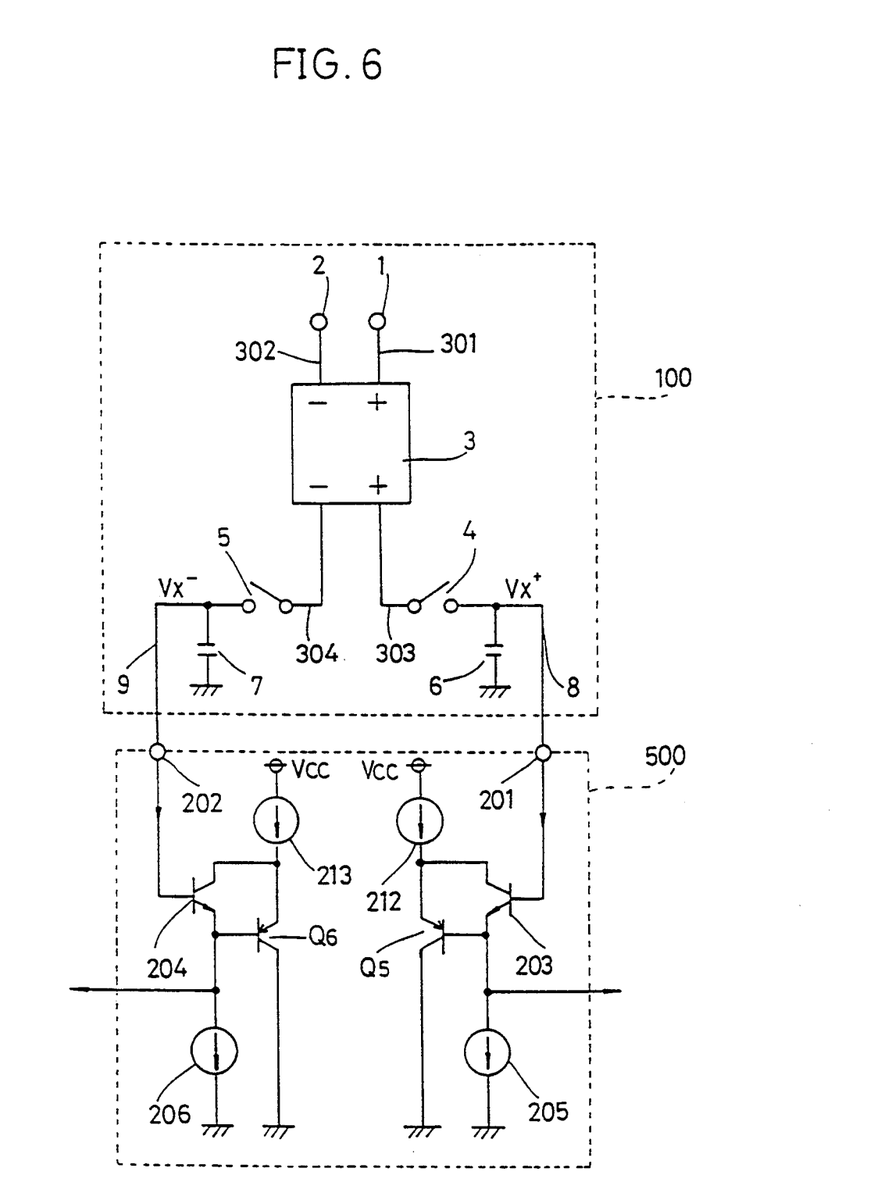
FIG. 6 shows a structure of a sample hold apparatus in accordance with a further embodiment of the present invention.

FIG. 6 shows a structure of a sample hold apparatus in accordance with a further embodiment of the present invention. Instead of the differential circuit 209 in the above described buffer circuits 300 and 400, a buffer circuit 500 includes PNP bipolar transistors Q5 and Q6 and constant current circuits 212 and 23. Transistor Q5 has its emitter connected to the collector of transistor 203 and to constant current circuit 212, and its base connected to the emitter of transistor 203. Transistor Q6 has its emitter connected to the collector of transistor 204 and to constant current circuit 213, and its base connected to the emitter of transistor 204. Collectors of transistors Q5 and Q6 are connected to a reference potential source (for example, ground). The output current values of constant current circuits 212 and 213 are the same, and they are selected to be larger than the output current values of constant current circuits 205 and 206.

The operation of buffer circuit 500 shown in FIG. 6 will be described. As in the embodiments of FIGS. 2 and 3, the same and constant current flows to emitters transistors 203 and 204 because of the constant current circuits 205 and 206. Therefore, the base-emitter voltages of transistors 203 and 204 are the same and constant. Since the same and constant current flows to emitters of transistors Q5 and Q6 by constant current circuits 212 and 213, the base-emitter voltages of transistors Q5 and Q6 have the same and the constant value. Therefore, the collector-emitter voltages of transistors 203 and 204 have the sam and constant value. Since the base-emitter voltages of transistors 203 and 204 have the same and constant value, the collector-base voltages of transistors 203 and 204 have the same and constant value. Consequently, base currents of transistors 203 and 204 become the same, and thus they do not affect the output potential difference of sample hold circuit 100.

Although buffer circuits 300, 400 and 500 shown in FIGS. 2, 3 and 6 are connected to sample hold circuit 100 of the present invention they may be connected to a voltage generating circuit 199 having high output impedance as shown in FIG. 9 to provide the same effect.

As described above, according to the present invention, respective output ends a differential circuit are connected to capacitors through switching means, whereby a stable sample hold circuit having an arbitrary gain can be provided.

In addition, in the present invention, collector voltages of two emitter follower transistors in a buffer circuit are controlled by voltage controlling means such that collector-base voltages of the emitter follower transistors become the same, and therefore the difference of input currents to the bases of the emitter follower transistors can be reduced. Consequently, even when a voltage generating circuit which provides an output voltage derived from the voltage held in capacitors or a voltage generating circuit having high output impedance is connected, a buffer circuit which do not affect the output voltage difference of the voltage generating circuits can be provided.

Although the present invention has been described and illustrated in detail, it is clearly understood that the same is by way of illustration and example only and is not to be taken by way of limitation, the spirit and scope of the present invention being limited by the terms of the appended claims.

What is claimed is:

1. A buffer circuit including two sets of emitter follower circuits for outputting two analog signals having a voltage difference corresponding to a voltage difference between two analog signals input thereto, comprising:
    a first bipolar transistor receiving at its base a first analog signal;
    a second bipolar transistor receiving at its base a second analog signal;
    a first constant current source connected to the emitter of said first bipolar transistor;
    a second constant current source connected to the emitter of said second bipolar transistor and having approximately the same current value as said first constant current source; and
    collector voltage controlling means for controlling collector voltages of said first and second bipolar transistors such that collector-base voltage of said first bipolar transistor is constantly the same as collector-base voltage of said second bipolar transistor.

2. The buffer circuit according to claim 1, wherein
    said collector voltage controlling means controls collector voltages of said first and second bipolar transistors based on emitter voltages of said first and second bipolar transistors.

3. The buffer circuit according to claim 2, wherein said collector voltage controlling means includes a differential circuit for changing a difference between the collector voltage of sad first bipolar transistor and the collector voltage of said second bipolar transistor corresponding to a difference between the emitter voltage of the first bipolar transistor and the emitter voltage of said second bipolar transistor.

4. The buffer circuit according to claim 3, wherein
    differential gain of said differential circuit is selected to be approximately 1.

5. The buffer circuit according to claim 2, wherein
    said collector voltage controlling means comprises
    a third bipolar transistor having its emitter connected to the collector of said first bipolar transistor, its base connected to the emitter of said first bipolar transistor and its collector connected to a reference potential source;
    a fourth bipolar transistor having its emitter connected to the collector of said second bipolar transistor, its base connected to the emitter of said second bipolar transistor, and its collector connected to the reference potential source;
    a third constant current source, connected to the collector of said first bipolar transistor and the emitter of said third bipolar transistor; and
    a fourth constant current source connected to the collector of said second bipolar transistor and the emitter of said fourth bipolar transistor and having approximately the same current value as said third constant current source.

6. The buffer circuit according to claim 5, wherein
    said first and second bipolar transistors include NPN bipolar transistors, and
    said third and fourth bipolar transistors include PNP bipolar transistors.

7. The buffer circuit according to claim 1, wherein
    said collector voltage controlling means controls the collector voltages of said first an second bipolar transistors based on the base voltages of said first and second bipolar transistors.

8. The buffer circuit according to claim 7, wherein said collector voltage controlling means includes a differential circuit for changing a difference between the collector voltage of sad first bipolar transistor and the collector voltage of said second bipolar transistor corresponding to a difference between the base voltage of said first bipolar transistor and the base voltage of said second bipolar transistor.

9. The buffer circuit according to claim 8, wherein differential gain of said differential circuit is selected to be approximately 1.

10. A sample hold apparatus, comprising:

a differential type sample hold circuit for sampling and holding a difference between voltages of two analog signals input thereto, and a buffer circuit including two sets of emitter follower circuits, receiving two analog signals sampled and held by said sample hold circuit and having a voltage difference corresponding to a voltage difference between these two analog signals; wherein said sample hold circuit includes a first differential circuit having first and second input terminals and first and second output terminals, a difference between output voltages at said first and second output terminals being changed corresponding to a difference between input voltages at said first and second input terminals, first and second switching means which are turned ON in a sampling period and turned OFF in a holding period, a first capacitor having one electrode connected to the first output terminal of said first differential circuit through said first switching means, and the other electrode connected to a reference potential source, and a second capacitor having one electrode connected to the second output terminal of said first differential circuit through said second switching means and the other electrode connected to the reference potential source, said first and second capacitors holding an output voltage from said first differential circuit when said first and second switching means a turned OFF; and said buffer circuit includes a first bipolar transistor having its base connected to one electrode of said first capacitor, a second bipolar transistor having its base connected to one electrode of said second capacitor, a first constant current source connected to the emitter of said first bipolar transistor, a second constant current source connected to the collector of said second bipolar transistor and having approximately the same current value as said first constant current source, and collector voltage controlling means for controlling collector voltages of said first add second bipolar transistors such that collector-base voltage of said first bipolar transistor is constantly the same as collector-base voltage of said second bipolar transistor.

* * * * *